(12) United States Patent
Chang et al.

(10) Patent No.: US 7,235,443 B2
(45) Date of Patent: Jun. 26, 2007

(54) NON-VOLATILE MEMORY AND METHOD OF MANUFACTURING FLOATING GATE

(75) Inventors: Ting-Chang Chang, Hsinchu (TW);
 Shuo-Ting Yan, Tainan County (TW);
 Po-Tsun Liu, Hsinchu (TW); Chi-Wen Chen, Chiayi County (TW);
 Tsung-Ming Tsai, Hsinchu (TW);
 Ya-Hsiang Tai, Hsinchu (TW);
 Simon-M Sze, Hsinchu (TW)

(73) Assignee: National Sun Yat-sen University, Kaohsiung (TW)

( * ) Notice: Subject to any disclaimer, the term of this patent is extended or adjusted under 35 U.S.C. 154(b) by 0 days.

(21) Appl. No.: 11/461,780

(22) Filed: Aug. 2, 2006

(65) Prior Publication Data

US 2006/0270158 A1 Nov. 30, 2006

Related U.S. Application Data

(62) Division of application No. 10/904,294, filed on Nov. 3, 2004, now abandoned.

(30) Foreign Application Priority Data

Nov. 3, 2003 (TW) .............................. 92130674 A
Jun. 29, 2004 (TW) .............................. 93118989 A

(51) Int. Cl.
 *H01L 21/336* (2006.01)
(52) U.S. Cl. .............................. 438/257; 257/E21.179; 257/E21.209
(58) Field of Classification Search ................ 438/257; 257/E21.179, E21.209
See application file for complete search history.

(56) References Cited

U.S. PATENT DOCUMENTS

| | | | | |
|---|---|---|---|---|
| 6,333,214 B1* | 12/2001 | Kim et al. | ................. | 438/142 |
| 6,656,792 B2* | 12/2003 | Choi et al. | ................. | 438/257 |
| 7,022,571 B2* | 4/2006 | Chang et al. | ................ | 438/257 |
| 2002/0098653 A1* | 7/2002 | Flagan et al. | ................ | 438/260 |
| 2005/0072989 A1* | 4/2005 | Bawendi et al. | ............ | 257/200 |
| 2005/0074939 A1* | 4/2005 | Ho et al. | ..................... | 438/264 |
| 2005/0112820 A1* | 5/2005 | Chen et al. | .................. | 438/257 |

* cited by examiner

*Primary Examiner*—Trung Dang
(74) *Attorney, Agent, or Firm*—Jianq Chyun IP Office

(57) ABSTRACT

A method of manufacturing a floating gate is provided. The method includes the steps of forming a tunneling layer on a substrate, and forming a film layer containing a semiconductor component on the tunneling layer. The film layer consists of a semiconductor film or nano-dots.

6 Claims, 19 Drawing Sheets

NON-VOLATILE MEMORY AND METHOD OF MANUFACTURING FLOATING GATE

CROSS-REFERENCE TO RELATED APPLICATION

This application is a divisional of a prior application Ser. No. 10/904,294, filed on Nov. 3, 2004 now abandoned claims the priority benefit of Taiwan application Ser. No. 92130674, filed on Nov. 3, 2003 and Taiwan application Ser. No. 93118989, filed on Jun. 29, 2004. All disclosures are incorporated herewith by reference.

BACKGROUND OF THE INVENTION

1. Field of the Invention

The present invention relates to a memory device, and more particularly to a non-volatile memory and a method of manufacturing a floating gate.

2. Description of the Related Art

Electronically erasable and programmable read only memory (EEPROM), among various of non-volatile memory devices, is suitable of performing multiple operations of writing, read and erasure, and is non-volatile even when power is off. As a result, EEPROM becomes a type of memory device widely used in personal computers and other electronic equipments.

In a EEPROM, doped polysilicon is conventionally used for fabricating a floating gate and a control gate. A dielectric layer is used to separate the floating gate from the control gate, while a tunneling layer is used to separate the floating gate from the substrate. When an operation of data writing/erasing is performed on the EEPROM, a bias voltage is applied on the control gate, the source region and the drain region so as to inject charges into the floating gate or withdraw charges from the floating gate. When data is read from the memory, an operating voltage is applied on the floating gate, and because the threshold voltage of the floating gate has been changed in the earlier write/erase operation, the difference of the threshold voltages can be used for differentiating the data value of 0 and 1.

Because the floating gate is made of a semiconductor material (e.g., polysilicon), electrons injected in the floating gate will be uniformly distributed in the entire layer of the floating gate. Upon multiple operations, if defects exist in the tunneling oxide layer below the layer of the polysilicon floating gate, electric leakage may easily occur to affect the device reliability. As a result, the thickness of the tunneling oxide layer cannot be reduced and a desirable lower operating voltage is hard to be obtained.

SUMMARY OF THE INVENTION

In view of the above, the present invention is directed to a method of manufacturing a floating gate, which can be employed to enhance reliability of memory devices.

The present invention is further directed to a non-volatile memory to solving the problems of that the operating voltage is too high and that the tunneling layer is too thick associated with the conventional floating gate.

To achieve the above and other objectives, the present invention provides a method of manufacturing a floating gate. A tunneling layer is formed on a substrate, and a film layer containing a semiconductor component is then formed on the tunneling layer. Wherein, the film layer consists of semiconductor nano-dots or film.

This invention also provides a non-volatile memory including a tunneling layer, a dielectric layer, a floating gate, a control gate, a source region, and a drain region. Wherein, the tunneling layer is disposed on a substrate; the dielectric layer is disposed between the floating gate and the control gate, while the floating gate contains a semiconductor component and consists of a semiconductor nano-dot or film; the control gate is disposed on the dielectric layer; and the source region and the drain region are disposed respectively on two sides of the control gate in the substrate.

In this invention, since the nano-dots or film containing a semiconductor component is used as an charge storing unit, when defects exist in the tunneling layer, only the charge of the nano-dots or film near the defective portion will be lost while the charge in other portions remains, so that the reliability of the device can be enhanced. In addition, even if the thickness of the tunneling layer is reduced, the reliability of the device will not be reduced, and thus the operating voltage can be lowered and the speed of write/erase operation can be increased.

It is to be understood that both the foregoing general description and the following detailed description are exemplary, and are intended to provide further explanation of the invention as claimed.

BRIEF DESCRIPTION OF THE DRAWINGS

Preferred embodiments of the present invention will now be described with reference to the accompanying drawings.

DESCRIPTION OF THE PREFERRED EMBODIMENTS

Reference will now be made in detail to the preferred embodiments of the invention, examples of which are illustrated in the accompanying drawings.

Figure 1:
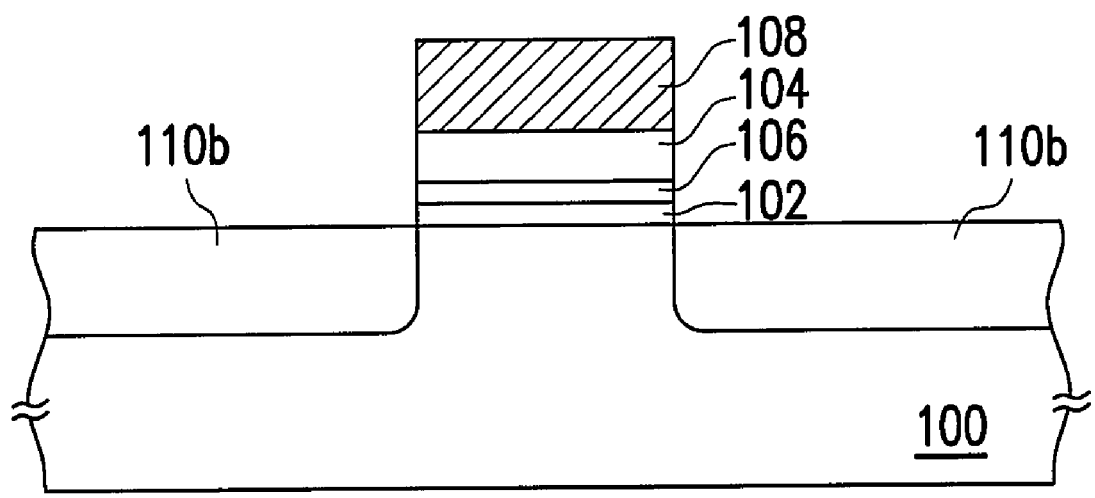
FIG. 1 is a sectional view showing a non-volatile memory according to a preferred embodiment of the present invention.
Figure 2:
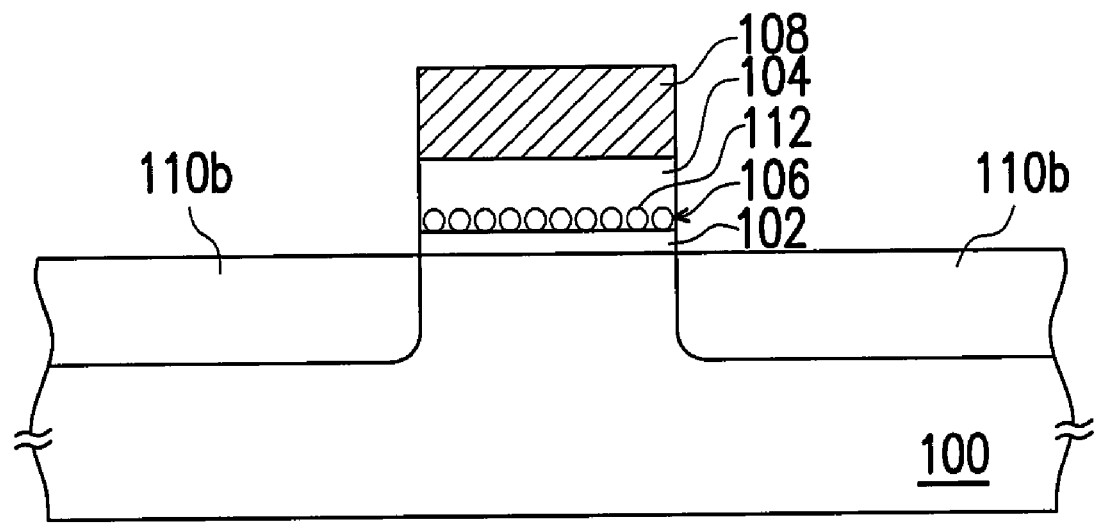
FIG. 2 is a sectional view showing a non-volatile memory according to another preferred embodiment of the present invention.

FIGS. 1 and 2 show respectively a non-volatile memory according to a preferred embodiment of the present invention. Referring to FIG. 1, the non-volatile memory contains substrate 100, tunneling layer 102, dielectric layer 104, floating gate 106, control gate 108, source region 110a, and drain region 110b.

Wherein, the substrate 100 is, for example, a polysilicon substrate. The tunneling layer 102 is disposed on the substrate 100 and is made of silicon oxide or other kind of dielectric. The dielectric layer 104 is disposed above the tunneling layer 102 as dielectric layer between the gates. The dielectric layer 104 is made of, for example, silicon oxide or other kind of dielectric.

The floating gate 106 is disposed between the tunneling layer 102 and the dielectric layer 104. In one preferred embodiment as shown in FIG. 1, the floating gate 106 consists of a film, a semiconductor film for example, containing a semiconductor component. In another preferred embodiment as shown in FIG. 2, the floating gate 106 consists of nano-dots 112 containing a semiconductor component, wherein the nano-dots 112 are, for example, semiconductor oxide nano-dots or semiconductor nano-dots. Here, the nano-dots refer to particles in the size of nanometer. The semiconductor components of the floating gate 106 include Group II elements, Group III elements, Group IV elements, Group V elements, Group VI elements, or compounds of the above elements. Here, Group II elements stand for elements of Group IIB in the periodic table, including zinc (Zn), cadmium (Cd) and mercury (Hg); Group III elements stand for elements of Group IIIA in the periodic table, including boron (B), aluminum (Al), gallium (Ga), indium (In) and thallium (Ti); Group IV elements stand for elements of Group IVA in the periodic table, including carbon (C), silicon (Si), germanium (Ge), Tin (Sn) and lead (Pd); Group V elements stand for VA elements in the periodic table, including nitrogen (N), phosphorus (P), arsenic (As), antimony (Sb) and bismuth (Bi); Group VI elements stand for Group VIA elements in the periodic table, including oxygen (O), sulfur (S), selenium (Se), tellurium (Te) and polonium (Po); and the compounds of the foregoing elements include semiconductor compounds of Group III and V elements, for example, gallium arsenide (GaAs), gallium phosphide (GaP), indium phosphide (InP), cadmium sulfide (CdS), zinc sulfide (ZnS) or zinc selenide (ZnSe).

In addition, the control gate 108 is disposed above the dielectric layer 104, while the source region 110a and the drain region 110b are disposed respectively on two sides of the control gate 108 in the substrate 100. Wherein, the source region 110a and the drain region 110b are, for example, doped regions containing n-type dopant.

In this invention, nano-dots or film containing a semiconductor component is used as charge storing unit of the floating gate. The nano-dots or film, such as semiconductor oxide film, semiconductor oxide nano-dots, or semiconductor nano-dots, is of insolating and non-continuous. As a result, when defects exist in the tunneling layer, only the charge of the nano-dots or film near the defective portion will be lost while the charge in other portions will remain, so that the reliability of the device can be enhanced. In addition, even if the thickness of the tunneling layer is reduced, the reliability of the device will not be reduced, and thus the operating voltage can be lowered and the speed of write/erase operation can be increased.

The aforementioned non-volatile memory is described with examples of memory with a staged gate structure. However, the memory of this invention include other type of memory with different structures, such as memory with segregate gates, memory with erasing gate and/or selecting gate, so long as the floating gate of this invention is used.

The following are some embodiments describing a method of manufacturing the non-volatile memory, which should not be construed as a limitation upon the scope of the present invention. The same reference numbers are used in the drawings to refer the same or like parts, and description of these parts will be omitted for simplicity.

First Embodiment

Figure 3A:
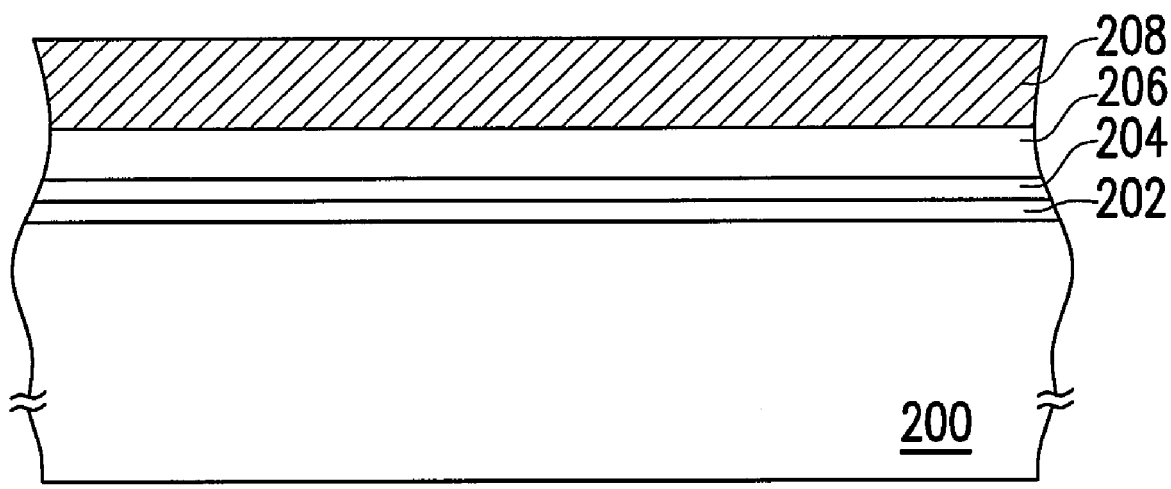
FIGS. 3A and 3B are sectional views showing a method of manufacturing a non-volatile memory according to a first preferred embodiment of the present invention.
Figure 3B:
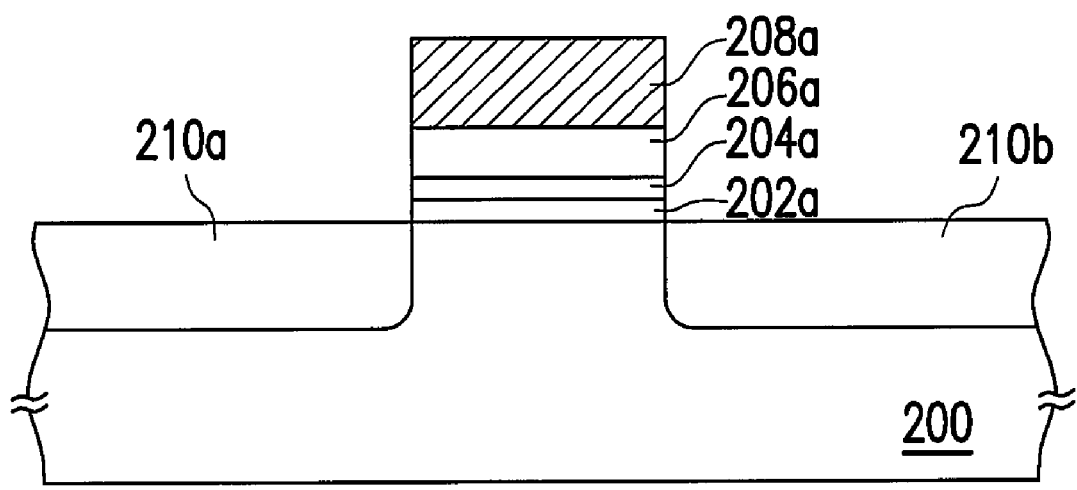

A first preferred embodiment of method of manufacturing the non-volatile memory of this invention is illustrated in FIGS. 3A and 3B.

Referring to FIG. 3A, a tunneling layer 202 is formed on a substrate 200. The substrate 200 is a silicon substrate for example, while the tunneling layer 202 is made of silicon oxide or other kind of dielectric, and is formed via a process such as thermal oxidation or chemical vapor deposition. In this embodiment, the tunneling layer 202 of silicon oxide is formed, for example, via dry oxidative deposition of a film of about 5 nm in a chemical vapor deposition chamber at 925° C. under normal pressure.

A semiconductor oxide layer 204 is then formed on the tunneling layer 202. The semiconductor oxide layer 204 is a film used as a floating gate. Here, the semiconductor oxide refers to element semiconductor or compound semiconductor. The semiconductor oxide layer 204 contains semiconductor components, which include Group II elements, Group III elements, Group IV elements, Group V elements, Group VI elements, or compounds of the above elements (for example, compound semiconductor of Group III and V elements, or compound semiconductor of Group II and VI elements). The preferred semiconductor components include Ge, As, GaAs. GaP, InP, CdS, ZnS, and ZnSe. In this embodiment, the semiconductor oxide layer 204 is made of Germanium oxide, and is formed, for example, via a process of physical vapor deposition or chemical vapor deposition. The process is carried out at a temperature of, for example, between 100 to 1000° C., and under a pressure of, for example, between 1 to 500 mTorr. The process of chemical vapor deposition can be, for example, low-pressure chemical vapor deposition, plasma enhanced chemical vapor deposition, high-density plasma chemical vapor deposition, or ultrahigh-vacuum chemical vapor deposition.

Next, a dielectric layer 206 is formed on the semiconductor oxide layer 204 to be used as dielectric layer between gates. The dielectric layer 206 is made of, for example, silicon oxide, and is formed via a process of, for example, chemical vapor deposition. Of course, the dielectric layer 206 can be also made of other kind of dielectric or composite dielectric consisting of one or more layers of dielectric materials (e.g., composite layers of $SiO_2/SiN/SiO_2$ or $SiN/SiO_2$). A conductive layer 208 is subsequently formed on the dielectric layer 206, while the conductive layer 208 is made of, for example, doped polysilicon, and is formed via a process of, for example, chemical vapor deposition.

Referring further to FIG. 3B, a dielectric layer 206a, semiconductor oxide layer 204a and tunneling layer 202a are formed after a step of patterning the conductive layer 208 for forming a control gate 208a, and a subsequent step of removing the dielectric layer 206, the semiconductor oxide layer 204 and the tunneling layer 202 that are not covered by the control gate 208a. Next, a source region 210a and a drain region 210b are formed in the substrate 200 on two sides of the control gate 208a, respectively. Wherein, the source region 210a and the drain 210b are formed via a process of, for example, ion implantation for implanting n-type or other type of dopant. The subsequent steps to finish the process of manufacturing the memory are commonly known and thus are omitted here.

Figure 4A:
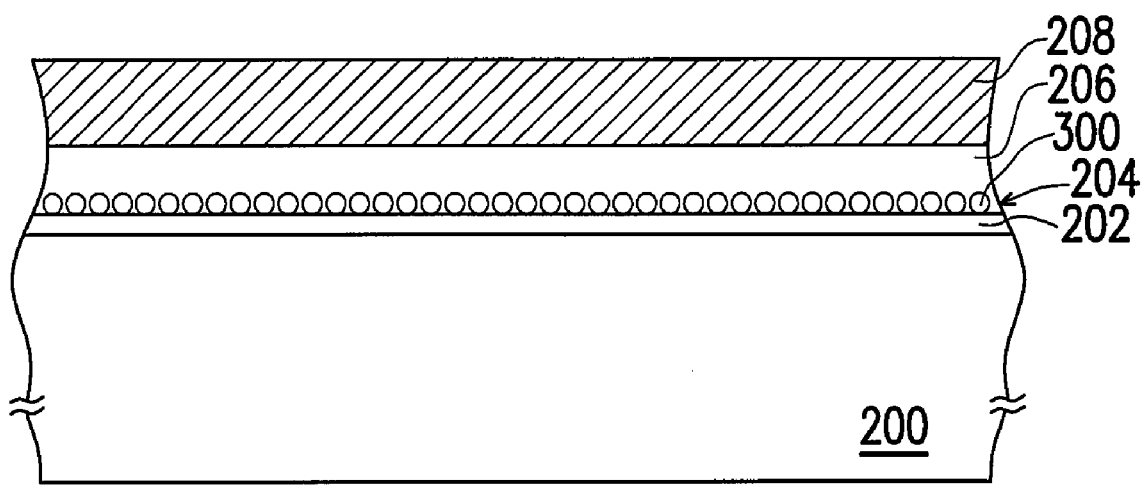
FIGS. 4A and 4B are sectional views showing a method of manufacturing another non-volatile memory according to the first preferred embodiment of the present invention.
Figure 4B:
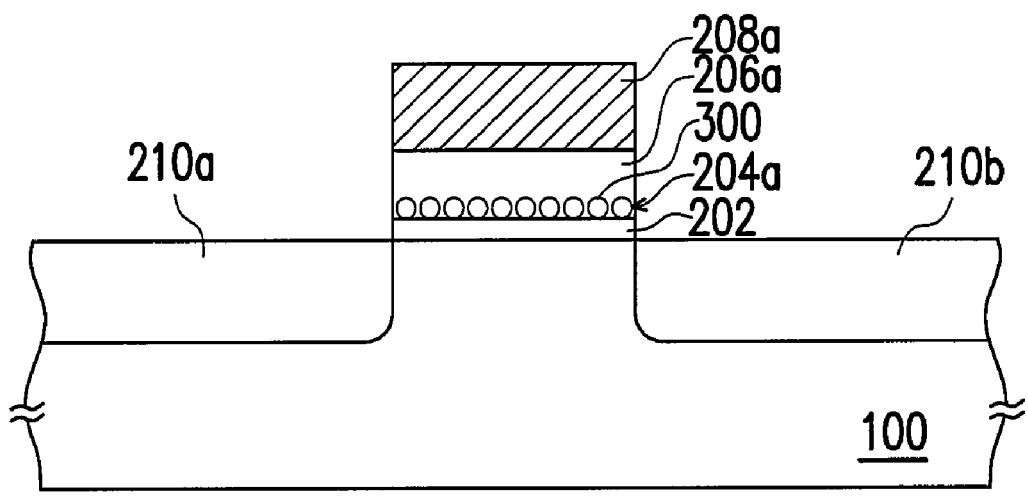

It is worthy of notice that the semiconductor oxide layer 204 can be alternatively formed such that the layer contains a plurality of semiconductor oxide nano-dots 300 as shown in FIG. 4A. The corresponding non-volatile memory formed via aforementioned manufacturing processes is shown in FIG. 4B.

Second Embodiment

A second preferred embodiment of method of manufacturing the non-volatile memory of this invention is illustrated in FIGS. 5A to 5D.

Figure 5A:
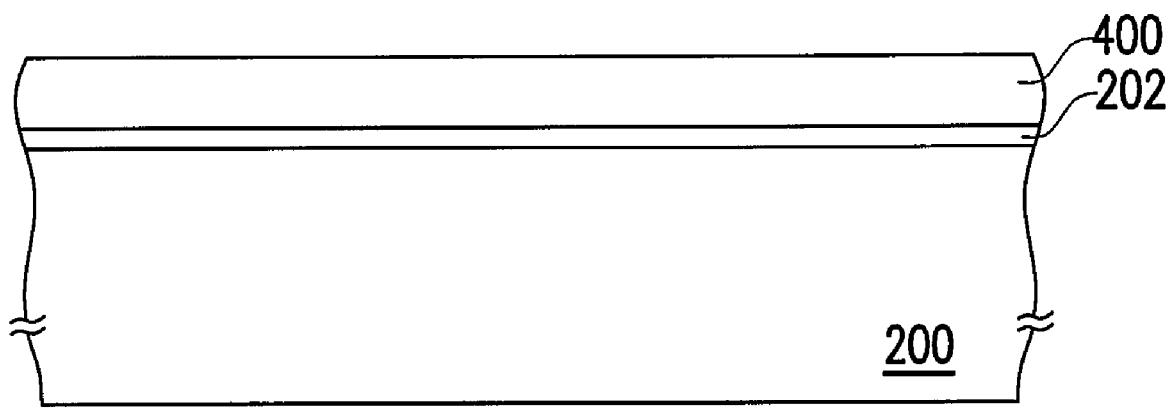
FIGS. 5A to 5D are sectional views showing a method of manufacturing a non-volatile memory according to a second preferred embodiment of the present invention.

Referring first to FIG. 5A, a substrate 200 is provided and a tunneling layer 202 is formed thereon. A semiconductor silicide layer 400 is then formed on the tunneling layer 202, wherein the semiconductor silicide refers to silicide of element semiconductor or compound semiconductor. The semiconductor silicide layer 400 contains semiconductor components, for example, as described in the first preferred embodiment. The semiconductor silicide layer 400, when made of $Si_{1-x}Ge_x$ (0<x<1), is formed via a process such as physical vapor deposition or chemical vapor deposition, and the process is carried out at a temperature of, for example, between 100 to 1000° C., and under a pressure of, for example, between 1 to 500 mTorr. The process of chemical vapor deposition can be, for example, low-pressure chemical vapor deposition, plasma enhanced chemical vapor deposition, high-density plasma chemical vapor deposition, ultrahigh-vacuum chemical vapor deposition. In this embodiment, the semiconductor silicide layer 400 is formed via a process of, for example, low-pressure chemical vapor deposition, while a layer of $Si_{1-x}Ge_x$ in a thickness of, for example, 20 nm is formed on the tunneling layer 202. The low-pressure chemical vapor deposition is carried out at about 550° C. and under about 460 mTorr, while the process gases are $SiH_4$ and $GeH_4$.

Figure 5B:
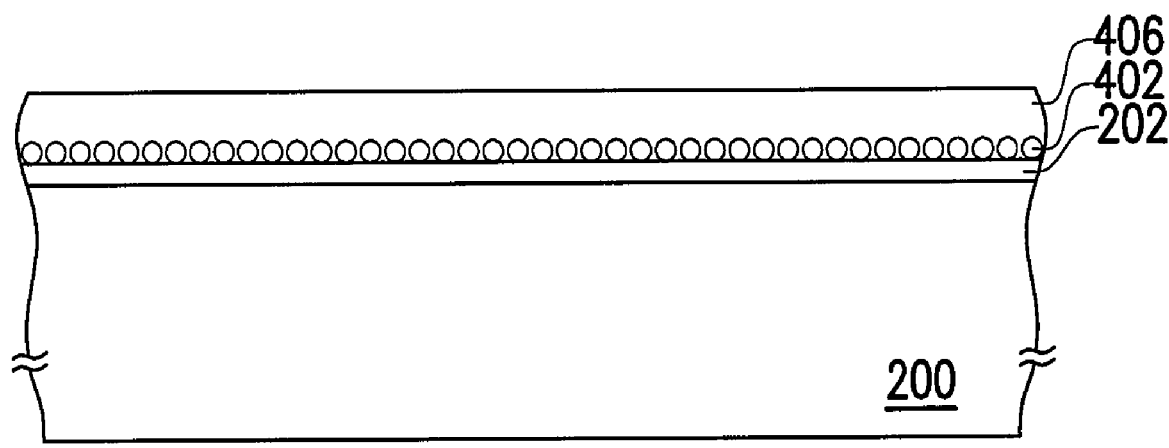

Referring to IG. FIG. 5B, an oxidation process is then performed to oxidize the semiconductor silicide layer 400, such that the semiconductor component of the silicide layer 400 is educed and settled on the tunneling layer 202 to form a plurality of semiconductor nano-dots 402. Thus, a silicon oxide layer 406 is formed. The oxidation process is of, for example, dry oxidation or wet oxidation, and the operating temperature is, for example, between 700 to 1100° C. In this embodiment, the semiconductor component (Ge atom) is educed through thermal oxidation. Particularly in a dry thermal oxidation process for example, the semiconductor silicide layer 400 (a film of GeSi) is oxidized to form a dielectric layer 406 (silicon oxide), and the semiconductor component (Ge atom) is simultaneously educed and settled on the tunneling layer 202 to form semiconductor nano-dots 402. In this embodiment, the dry thermal oxidation process is carried out at about 900° C.

After the foregoing oxidation process, a thermal process can be further performed to reduce the partially oxidized semiconductor component (Ge atom) for driving the educing process to completion. In this embodiment, the thermal process is performed via rapid thermal annealing (RTA) at 950° C. for 30 second for example.

Figure 5C:
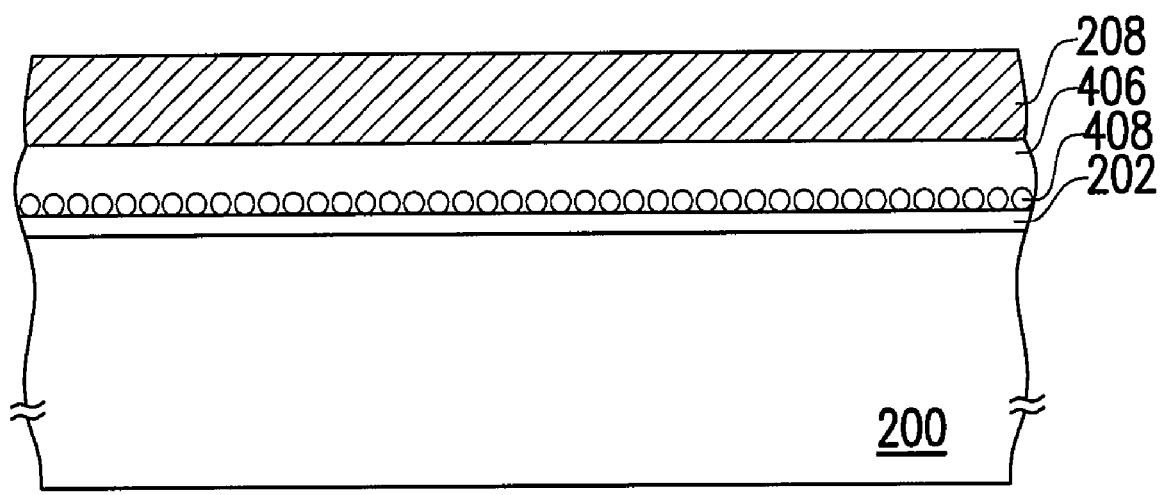

Referring next to FIG. 5C, an additional oxidation process is carried out to convert the semiconductor nano-dots 402 to semiconductor oxide nano-dots 408. Here, the semiconductor oxide nano-dots 408 are used as a floating gate, and the dielectric layer 406 is used as gate partitioning dielectric to separate the semiconductor oxide nano-dots 408 (floating gate) from the subsequently formed control gate. This oxidation process is of, for example, wet oxidation, and the operating temperature is about 978° C.

A conduction layer 208 is then formed on the dielectric layer 406. Of course, before the formation of the conduction layer 208, another dielectric layer (not shown) can be formed on the dielectric layer 406 to be used jointly with the dielectric layer 406 as gate partitioning dielectric and to ensure the isolation between the conduction layer 208 and the semiconductor oxide nano-dots 408.

Figure 5D:
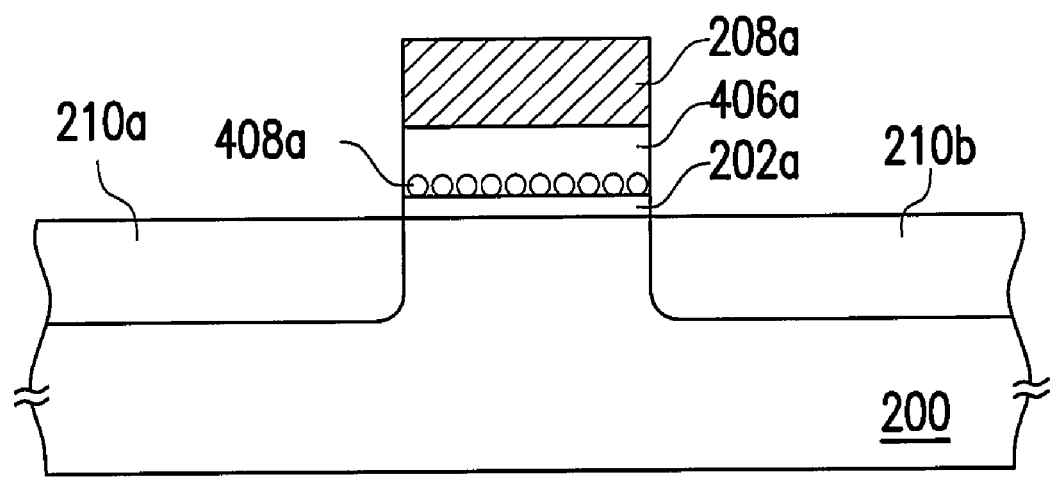

Referring further to FIG. 5D, after the conduction layer 208 is patternized to form a control gate 208a, portions of the dielectric layer 204, the semiconductor oxide nano-dots 408 and the tunneling layer 202 that are not covered by the control gate 208a are removed, and thus dielectric layer 406a, semiconductor oxide nano-dots 408a and tunneling layer 202a are formed. Afterward, a source region 210a and a drain region 210b are formed respectively on the two sides of the control gate 208a in the substrate 200. The subsequent processes to complete the fabrication of the memory are commonly known and thus are omitted here for simplicity.

Third Embodiment

Figure 6A:
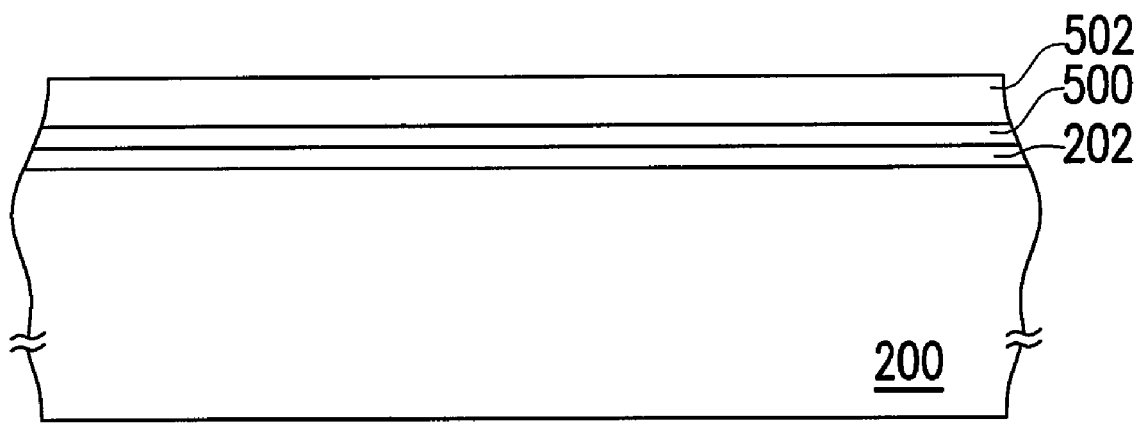
FIGS. 6A to 6C are sectional views showing a method of manufacturing a non-volatile memory according to a third preferred embodiment of the present invention.
Figure 6B:
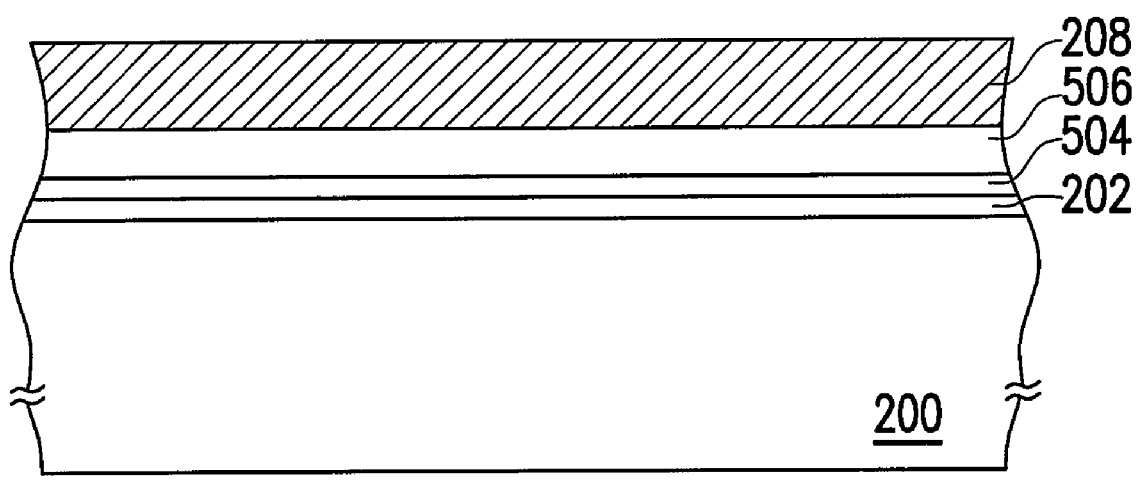
Figure 6C:
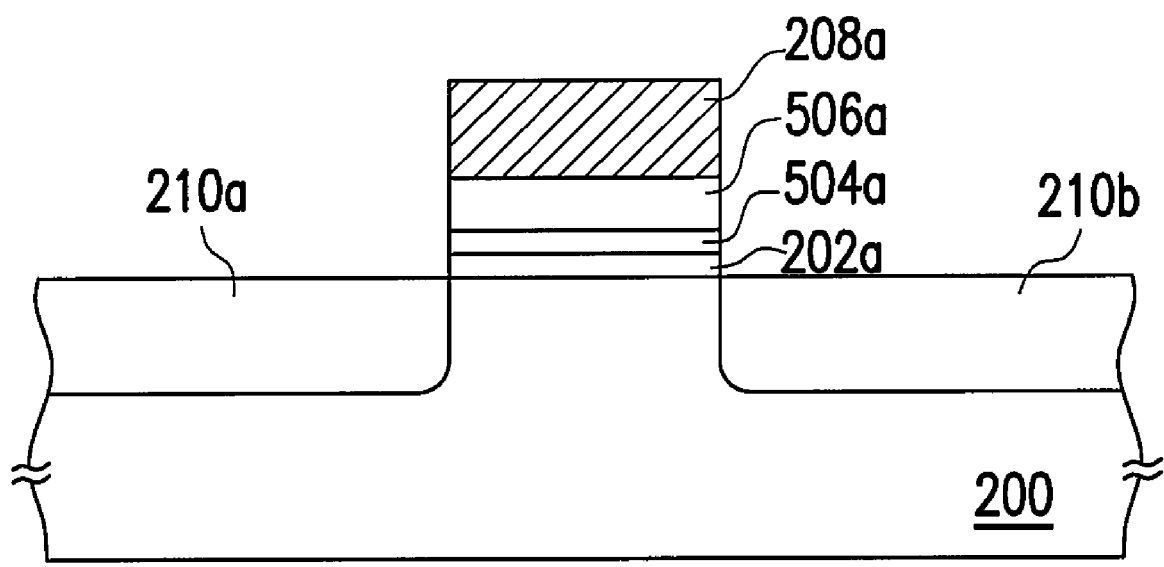

A third preferred embodiment of method of manufacturing the non-volatile memory of this invention is illustrated in FIGS. 6A to 6C.

Referring first to FIG. 6A, a substrate 200 is provided, and a tunneling layer 202 is formed thereon. A semiconductor layer 500, a thin film, is then formed on the tunneling layer 202, while the semiconductor layer 500 is made of, for example, the components as mentioned in the first embodiment. In this embodiment, the semiconductor layer 500 is made of, for example, germanium (Ge) in a thickness of 1 to 10 nm, and is formed, for example, via a process of physical vapor deposition or chemical vapor deposition. The process is carried out at a temperature of, for example, between 100 to 1000° C., and under a pressure of, for example, between 1 to 500 mTorr. The process of chemical vapor deposition can be, for example, low-pressure chemical vapor deposition, plasma enhanced chemical vapor deposition, high-density plasma chemical vapor deposition, or ultrahigh-vacuum chemical vapor deposition. As shown in FIG. 6A, a silicon layer 502 is consequently formed on the semiconductor layer 500 via a process of, for example, chemical vapor deposition.

Referring next to FIG. 6B, an oxidation process is carried out to convert the semiconductor layer 500 and the silicon layer 502 to a semiconductor oxide layer 504 and a silicon oxide dielectric layer 506, respectively. Particularly, the semiconductor oxide layer 504 and the silicon oxide dielectric layer 506 can be formed simultaneously during this oxidation process. Here, the semiconductor oxide layer 504 is used as a floating gate, and the dielectric layer 506 is used as gate partitioning dielectric to separate the semiconductor oxide layer 504 (floating gate) from a subsequently formed control gate. In this embodiment, the semiconductor layer 500 is made of germanium (Ge), and the semiconductor oxide layer 504 formed therefrom is of germanium oxide. The oxidation process is carried out at a temperature of, for example, between 700 to 1100° C.

Next, a conduction layer 208 is formed on the dielectric layer 506. Of course, before the formation of the conduction layer 208, another dielectric layer (not shown) can be formed on the dielectric layer 506, to be used jointly with the dielectric layer 506 as gate partitioning dielectric and to ensure the isolation of the conduction layer 208 and the semiconductor oxide layer 508.

Referring further to FIG. 6C, after the conduction layer 208 is patternized to form a control gate 208a, portions of the dielectric layer 504, the semiconductor oxide layer 504 and the tunneling layer 202 that are not covered by the control gate 208a are removed, and thus dielectric layer 506a, semiconductor oxide layer 504a and tunneling layer 202a are formed. Afterward, a source region 210a and a drain region 210b are formed respectively on the two sides of the control gate 208a in the substrate 200. The subsequent processes to complete the fabrication of the memory are commonly known and thus are omitted here for simplicity.

Figure 7A:
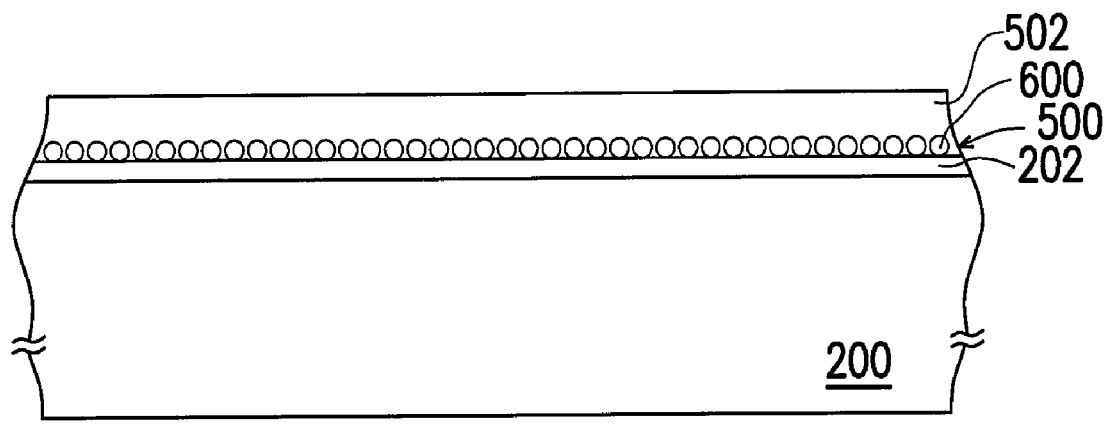
FIGS. 7A and 7B are sectional views showing a method of manufacturing another non-volatile memory according to the third preferred embodiment of the present invention.
Figure 7B:
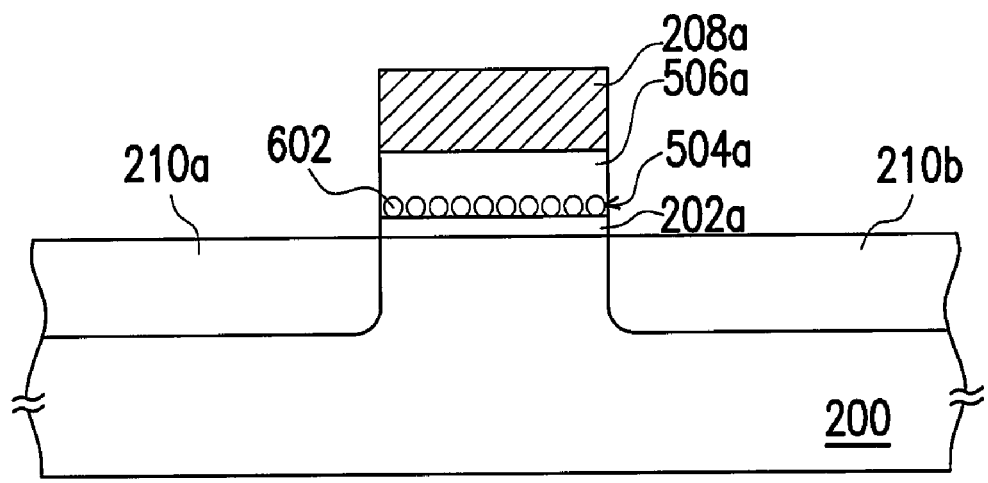

It is worthy of notice that the semiconductor oxide layer 500 can be alternatively formed such that the layer contains a plurality of semiconductor oxide nano-dots 600 as shown in FIG. 7A. The corresponding non-volatile memory formed via aforementioned manufacturing processes is shown in FIG. 7B.

Fourth Embodiment

Figure 8A:
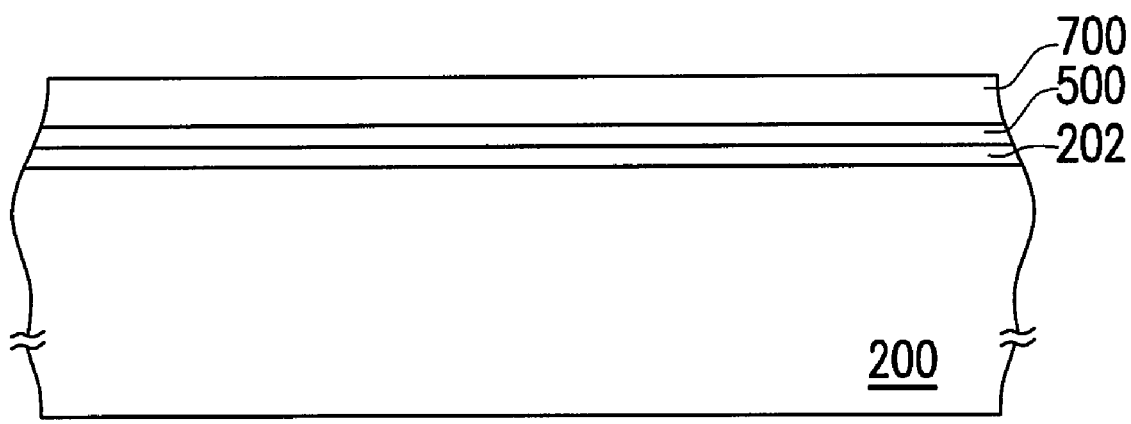
FIGS. 8A to 8C are sectional views showing a method of manufacturing a non-volatile memory according to a forth preferred embodiment of the present invention.
Figure 8B:
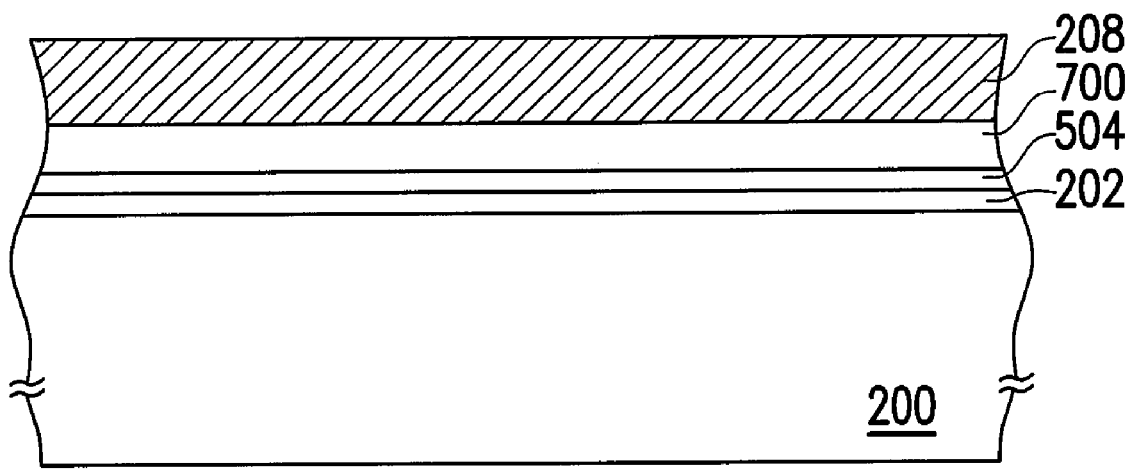
Figure 8C:
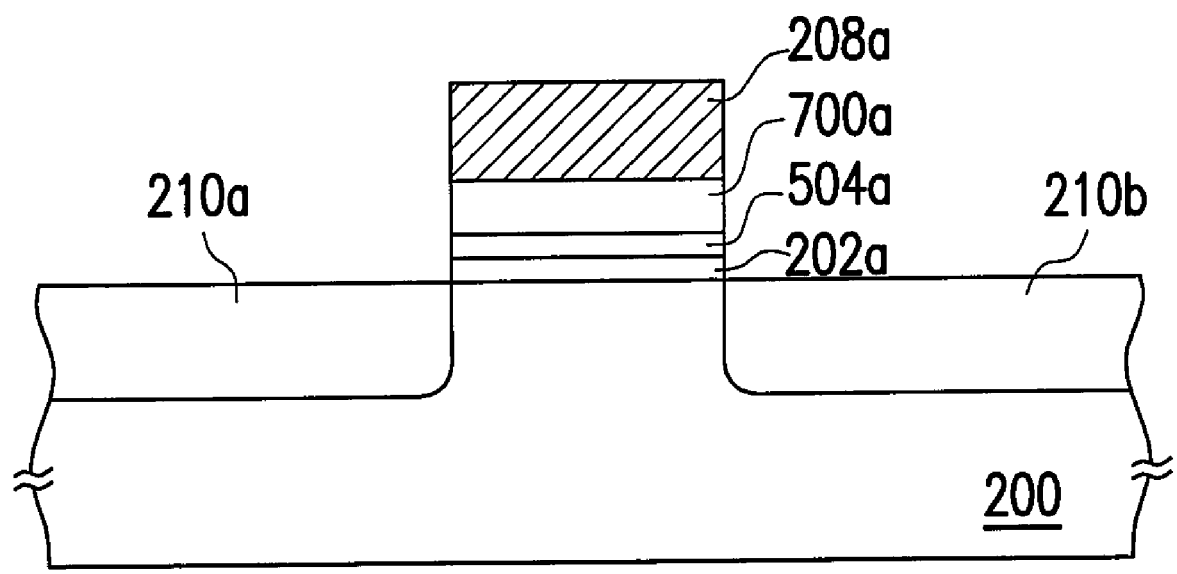

A fourth preferred embodiment of method of manufacturing the non-volatile memory of this invention is illustrated in FIGS. 8A to 8C.

Referring first to FIG. 8A, a substrate 200 is provided and a tunneling layer 202 is formed thereon. A semiconductor layer 500, a thin film, is then formed on the tunneling layer 202, while the semiconductor layer 500 is made of, for example, the components as mentioned in the first embodiment.

A dielectric layer 700 is then formed on the semiconductor layer 500. Wherein, the dielectric layer 700 id made of, for example, silicon oxide, and is formed via a process of, for example, chemical vapor deposition.

Referring next to FIG. 8B, an oxidation annealing process is performed to convert the semiconductor layer 500 to a semiconductor oxide layer 504. Here, the semiconductor oxide layer 504 is used as a floating gate, and the dielectric layer 700 is used as gate partitioning dielectric to separate the semiconductor oxide layer 504 (floating gate) from the subsequently formed control gate. In this embodiment, the semiconductor layer 500 is made of germanium (Ge), and the semiconductor oxide layer 504 formed therefrom is of germanium oxide. The oxidation annealing process is, for example, quartz furnace annealing or rapid thermal annealing process, and is carried out at a temperature of, for example, between 700 to 1100° C.

Next, conduction layer 208 is formed on the dielectric layer 700. Of course, before the formation of the conduction layer 208, another dielectric layer (not shown) can be formed on the dielectric layer 700, to be used jointly with the dielectric layer 700 as gate partitioning dielectric and to ensure the isolation of the conduction layer 208 and the semiconductor oxide layer 700.

Referring further to FIG. 8C, after the conduction layer 208 is patternized to form a control gate 208a, portions of the dielectric layer 700, the semiconductor oxide layer 504 and the tunneling layer 202 that are not covered by the control gate 208a are removed, and thus dielectric layer 700a, semiconductor oxide layer 504a and tunneling layer 202a are formed. Afterward, a source region 210a and a drain region 210b are formed respectively on the two sides of the control gate 208a in the substrate 200. The subsequent processes to complete the fabrication of the memory are commonly known and thus are omitted here for simplicity.

Figure 9A:
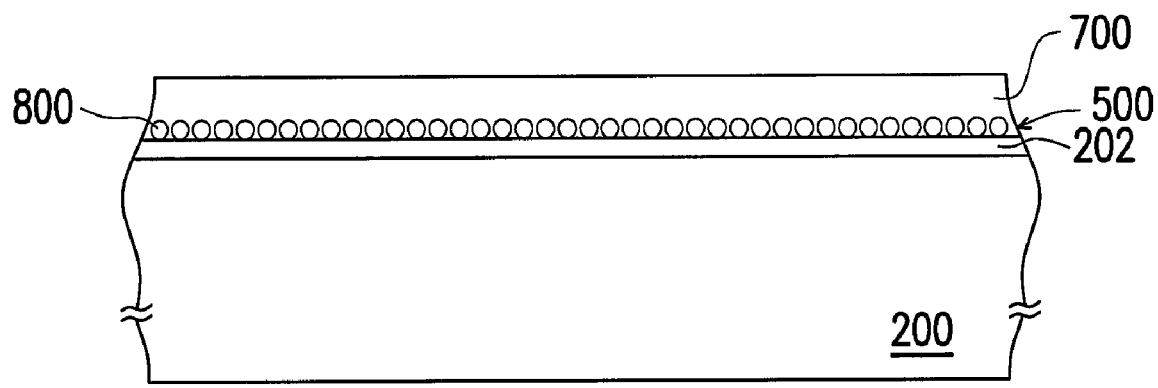
FIGS. 9A and 9B are sectional views showing a method of manufacturing another non-volatile memory according to the forth preferred embodiment of the present invention.
Figure 9B:
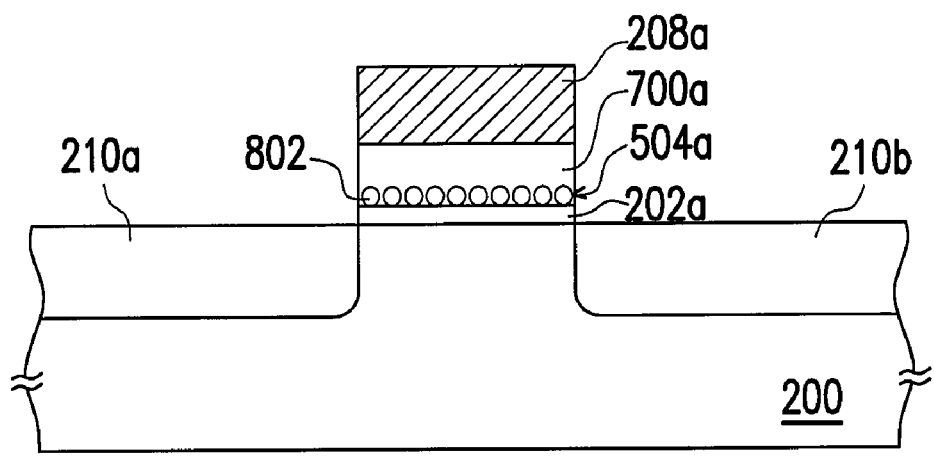

It is worthy of notice that the semiconductor oxide layer 500 can be alternatively formed such that the layer contains a plurality of semiconductor oxide nano-dots 800 as shown in FIG. 9A. The corresponding non-volatile memory formed via aforementioned manufacturing processes is shown in FIG. 9B.

Fifth Embodiment

A fifth preferred embodiment of method of manufacturing the non-volatile memory of this invention is illustrated in FIGS. 10A to 10D.

Figure 10A:
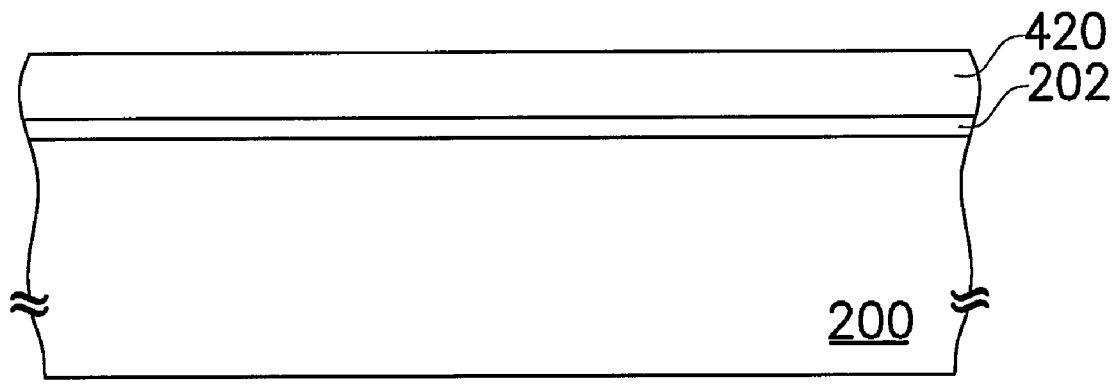
FIGS. 10A to 10D are sectional views showing a method of manufacturing a non-volatile memory according to a fifth preferred embodiment of the present invention.

Referring first to FIG. 10A, a substrate 200 is provided and a tunneling layer 202 is formed thereon. A semiconductor silicide layer 420 is then formed on the tunneling layer 202. Here, the semiconductor silicide refers to silicide of element semiconductor or compound semiconductor. The semiconductor silicide layer 420 is made of, for example, the components as mentioned in the first embodiment. In this embodiment, the semiconductor silicide layer 420, when made of $Si_{1-x}Ge_x$ (0<x<1), is formed via a process, such as chemical vapor deposition, wherein a germanium silicide layer is formed on the tunneling layer 202 in a thickness of, for example, 20 nm. The germanium silicide layer is then patternized. The low-pressure chemical vapor deposition is carried out at, for example, between 450 to 650° C. and under about 460 mTorr, while the process gases are $SiH_4$ and $GeH_4$.

Figure 10B:
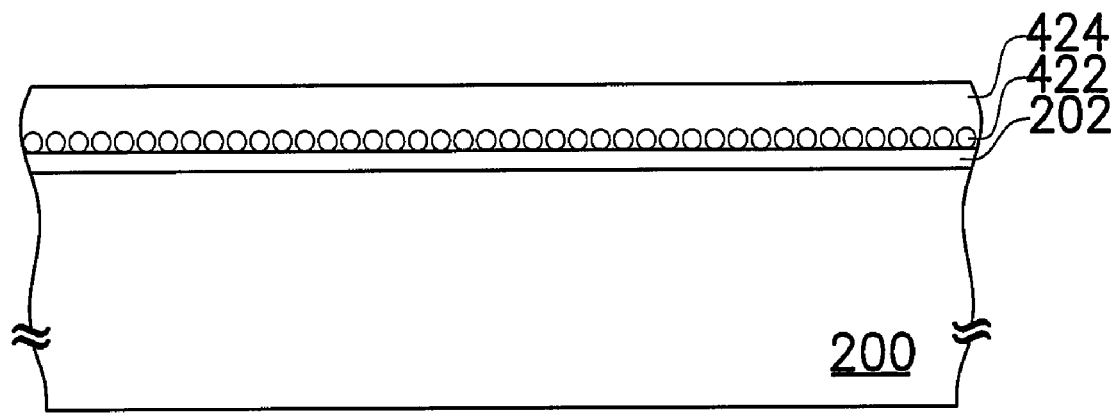

Referring next to FIG. 10B, a semiconductor nano-dots educing process is performed so that the semiconductor component of the semiconductor silicide layer 420 is educed and settled on the tunneling layer 202 to form a plurality of semiconductor nano-dots 402 at the time when the dielectric layer 424 is formed. Wherein, the dielectric layer 424 is used for separating the semiconductor nano-dots 422 (floating gate) from a subsequently formed control gate. In this embodiment, the semiconductor component (Ge atom) is educed through thermal oxidation. Particularly in a dry thermal oxidation process for example, the semiconductor silicide layer 420 (a film of GeSi) is oxidized to form a dielectric layer 424 (silicon oxide), and the semiconductor component (Ge atom) is simultaneously educed and settled on the tunneling layer 202 to form semiconductor nano-dots 422. The dry oxidation process is carried out at a temperature of, for example, between 800 to 1500° C. Afterward, a thermal process is performed to reduce the partially oxidized semiconductor component (Ge atom) for driving the educing process to completion. The thermal process is performed via rapid thermal annealing (RTA) at 800~1500° C. for example. Of course, the semiconductor component educing process is not limited to thermal process but can be other processes such as nitrification.

Figure 10C:
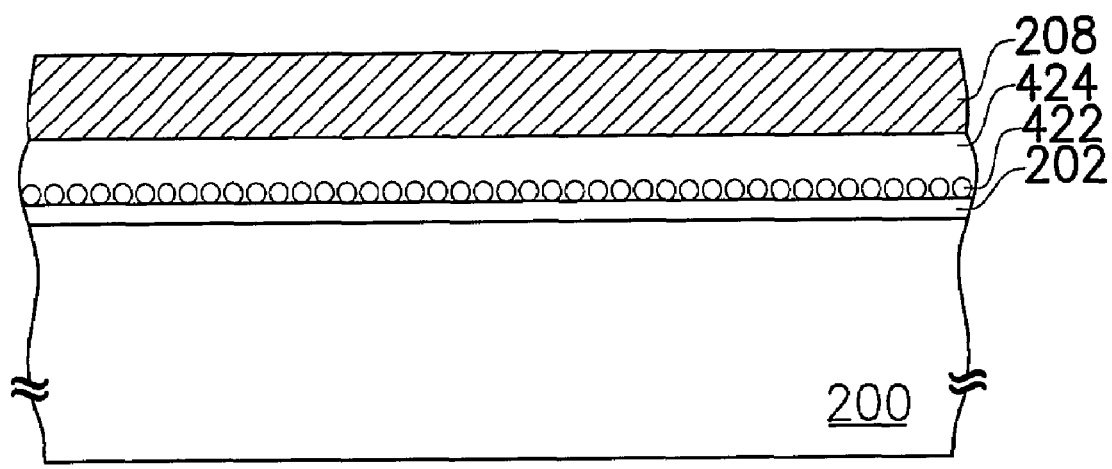

Referring to FIG. 10C, a conduction layer 208 is then formed on the dielectric layer 424. Of course, before the formation of the conduction layer 208, another dielectric layer (not shown) can be formed on the dielectric layer 424 to be used jointly with the dielectric layer 424 as gate partitioning dielectric and to ensure the isolation between the conduction layer 208 and the semiconductor nano-dots 422.

Figure 10D:
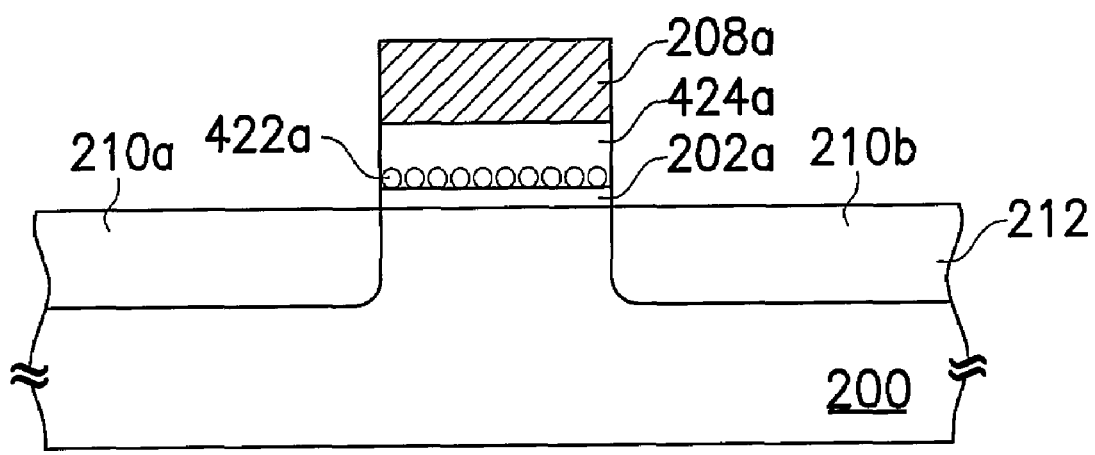

Referring further to FIG. 10D, after the conduction layer 208 is patternized to form a control gate 208a, portions of the dielectric layer 424, the semiconductor nano-dots 422 and the tunneling layer 202 that are not covered by the control gate 208a are removed. Afterward, a source region 210a and a drain region 210b are formed respectively on the two sides of the control gate 208a in the substrate 200. The subsequent processes to complete the fabrication of the memory are commonly known and thus are omitted here for simplicity.

As known from the above, this invention uses insolating and non-continuous film containing a semiconductor component, such as semiconductor oxide film, semiconductor oxide nano-dots, or semiconductor nano-dots, as the charge-storing unit (floating gate). As a result, when defects exist in the tunneling layer, only the charge of the nano-dot or film near the defective portion will be lost while the charge in other portions will remain, so that the reliability of the device can be enhanced. In addition, even if the thickness of the tunneling layer is reduced, the reliability of the device will not be reduced, and thus the operating voltage can be lowered and the speed of write/erase operation can be increased.

On the other hand, the processes as disclosed in the foregoing embodiments are simple and are compatible with commonly used process equipments, and thus no extra facilities are required. In addition, the non-volatile memory with the gate structure of this invention can be widely used for fabrication of semiconductor integrated circuits, mobile telephones, notebook computers, USB pocket memory, and IC cards.

It should be noted that the above-mentioned process parameters are exemplary and should not be construed as limitations on the scope of this invention. The parameters may be varied according to actual conditions of the processes.

Next, this invention is further described in the following examples of preparing tested units and performing tests thereon.

Experiment 1

Preparation of Tested Unit: A silicon chip 900, after cleaned with a RCA cleaning agent, is oxidized to form silicon oxide thereon as a tunneling layer 902. A film of germanium silicide is deposited on the tunneling layer 902, and is then converted through high-temperature oxidation into a silicon dioxide layer 904, while the germanium atoms are educed and settled on the tunneling layer 902 to form germanium nano-dots (not shown). Next, a high-temperature annealing step is performed to drive the germanium nano-dots deducing process to completion. Another oxidation process is carried out to convert the germanium nano-dots into germanium oxide nano-dots 906. Afterward, a control gate 907 is formed on the silicone dioxide layer 907.

Figure 11:
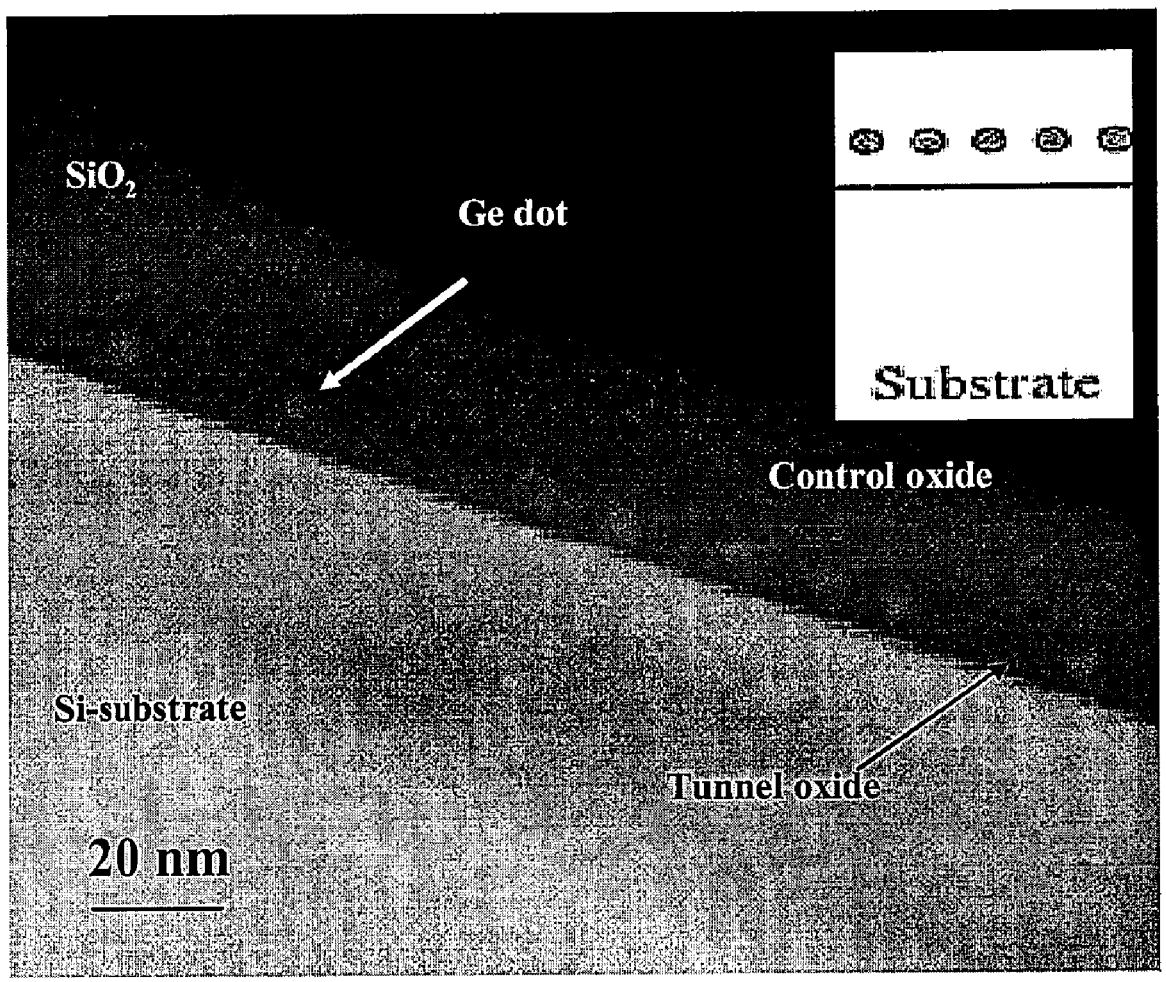
FIG. 11 is a photograph of a tested unit under a transmission electron microscope according to experiment 1.

FIG. 11 is a photograph of a tested unit under a transmission electron microscope. As shown in FIG. 11, the educed germanium oxide nano-dots 906 are 5~5.5 nm in diameter, and the nano-dots are separated from each other.

Figure 12:
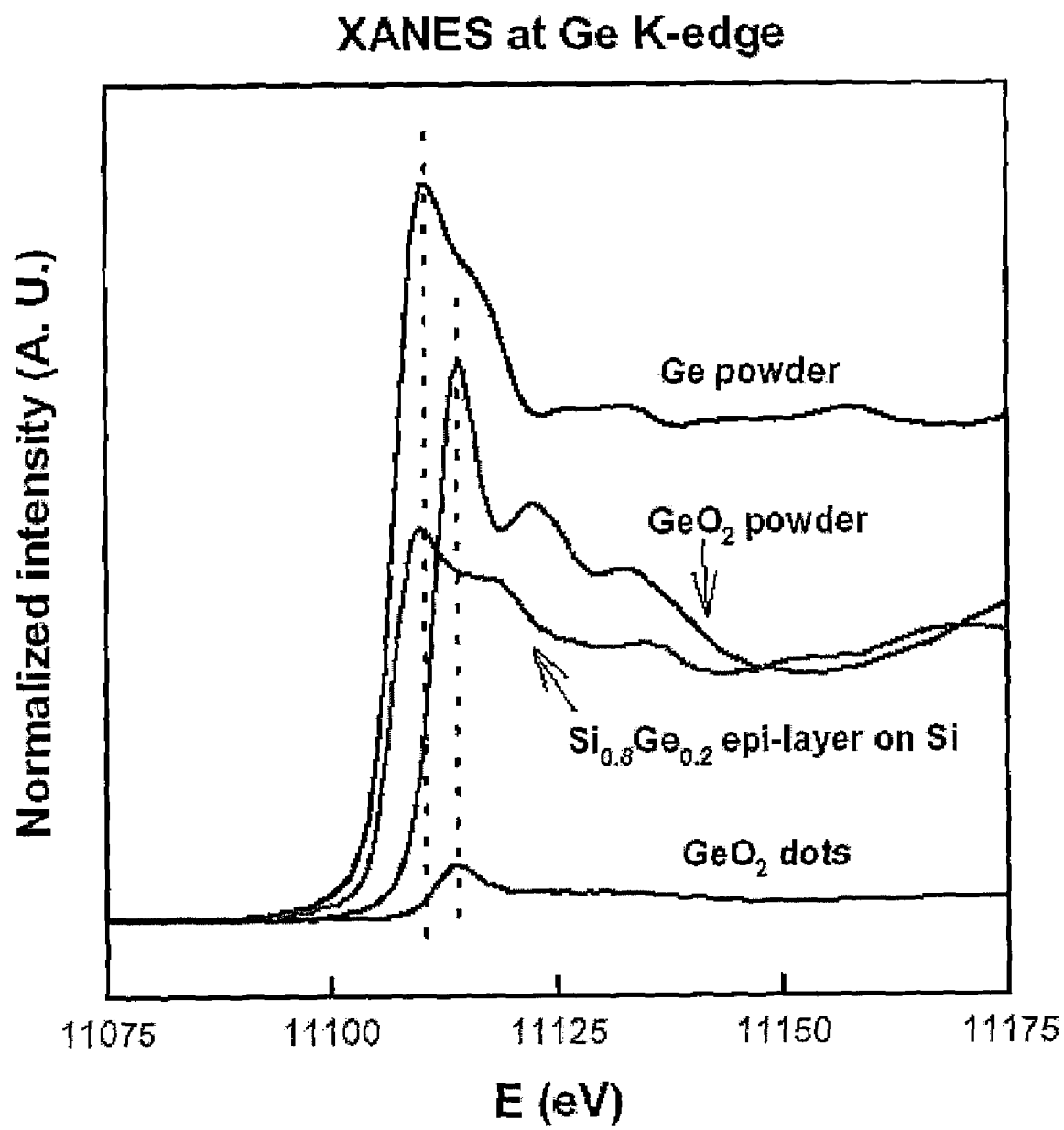
FIG. 12 is an absorption spectrum of a tested unit obtained by using an X-ray absorption near edge spectrometry according to experiment 2.

FIG. 12 is an absorption spectrum of the tested unit obtained by using an X-ray absorption near edge spectrometry (XANES). Three types of control materials are germanium powder (curve 908), germanium oxide powder (curve 910), and $Si_{0.8}Ge_{0.2}$ epitaxy film (curve 912). As shown in FIG. 12, the X-ray absorption position for germanium oxide nano-dots (curve 914) is the same as that for germanium oxide powder (curve 910), which confirms that the nano-dots on the tunneling layer are of germanium oxide.

Figure 13:
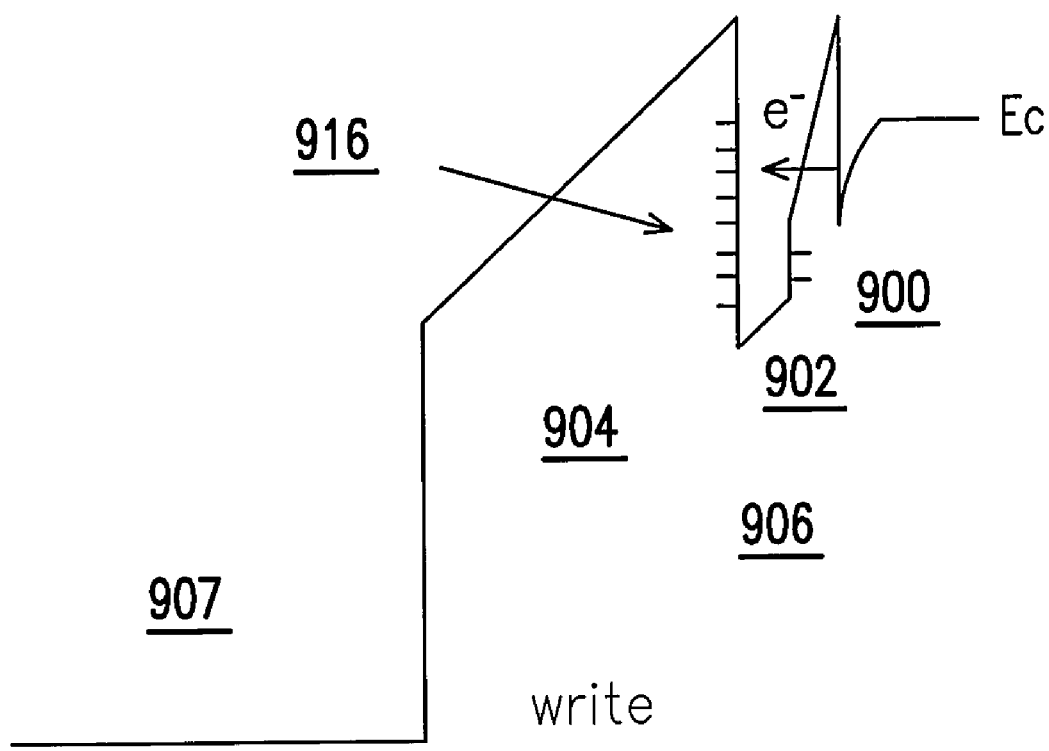
FIG. 13 shows sketches of energy bands of write and erase operations when nano-dots of germanium oxide are used as the floating gate of the memory according to experiment 1.
Figure 13:
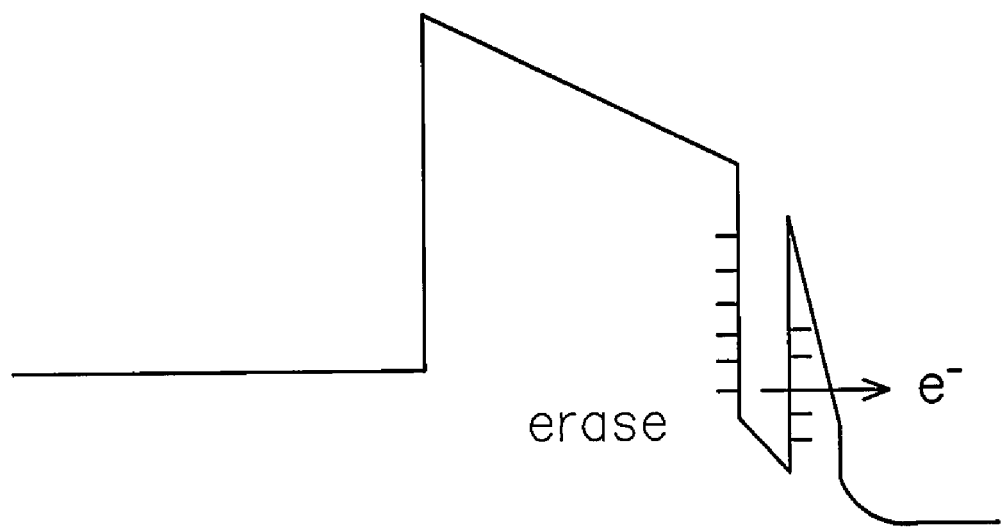

FIG. 13 shows energy bands of write and erase operations when nano-dots of germanium oxide are used as the floating gate of the memory. It is known from FIG. 13 that the charge ($e^-$), after passing the tunneling, will be stored at the interfacial defective spots 916 at the interfaces between the germanium oxide nano-dots 906 and the tunneling layer 902 as well as between the germanium oxide nano-dots 906 and the control gate 907.

Figure 14:
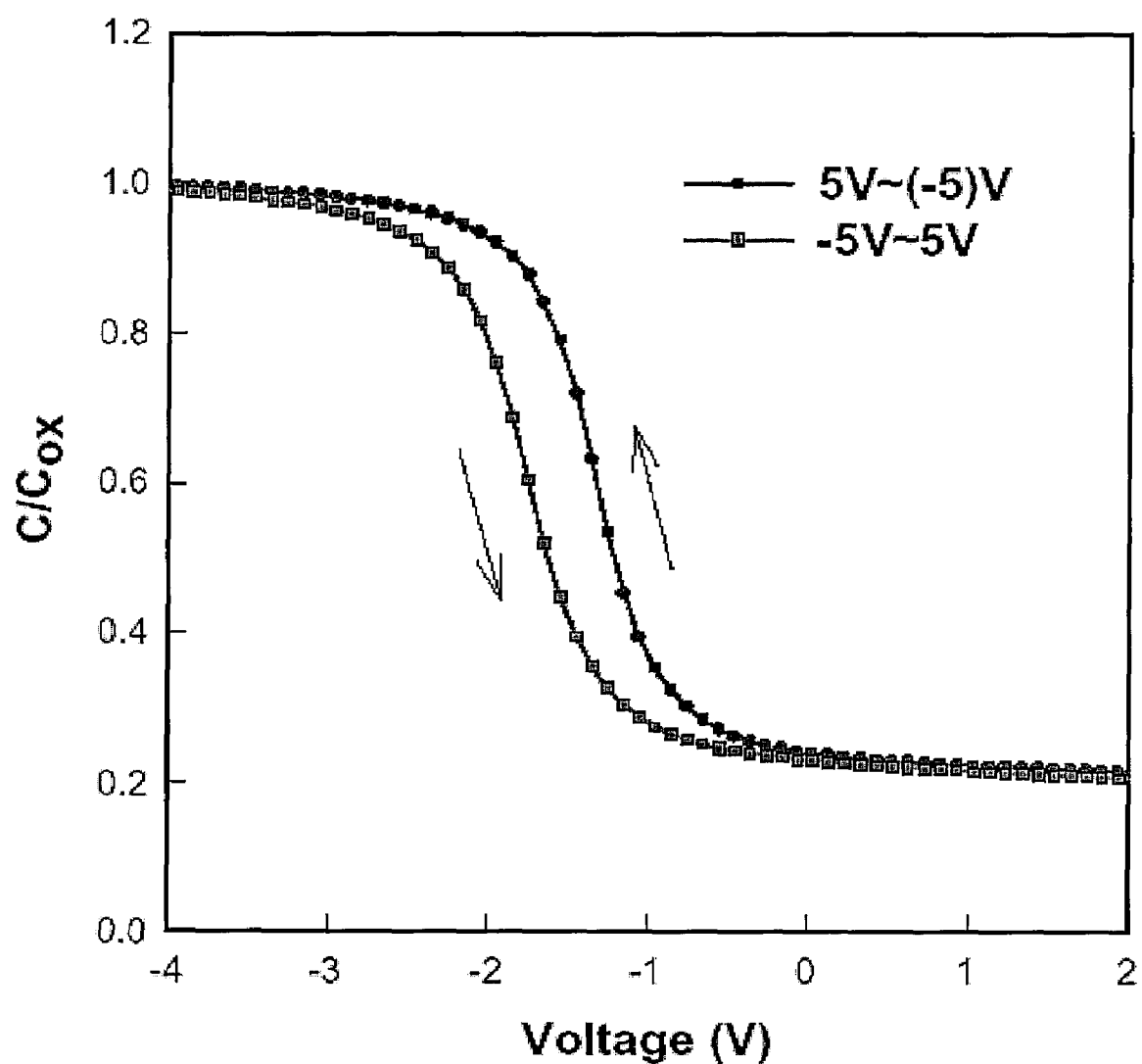
FIG. 14 is a graph showing relationship of capacitance and voltage of the tested unit of experiment 1 through two-way scan.

Testing of Tested Unit: FIG. 14 illustrates relationship of capacitance and voltage of the tested unit through two-way scan. The tested unit is scanned from 5 V to −5V and then scanned backwards. For operations of electron injecting or erasing, the curves of capacitance versus voltage (shown in FIG. 14) indicate that the deviation of the threshold voltage (i.e., memory window) can reach to 0.45 V under an operating voltage of 5 V. Such a deviation is big enough to be used for differentiating the date value 0 and 1 of a logical circuit. Thus, the floating gate of this invention can be used in memory devices.

Experiment 2

Preparation of Tested Unit: A silicon chip 920, after cleaned with a RCA cleaning agent, is oxidized to form silicon oxide thereon as a tunneling layer 922. A film of germanium silicide is deposited on the tunneling layer 922, and is then converted through high-temperature oxidation into a silicon dioxide layer 926, while the germanium atoms are educed and settled on the tunneling layer 922 to form germanium nano-dots 924. Next, a high-temperature annealing step is performed to drive the germanium nano-dots deducing process to completion. A conduction layer is subsequently formed on silicon dioxide of the tunneling layer 922.

Figure 15:
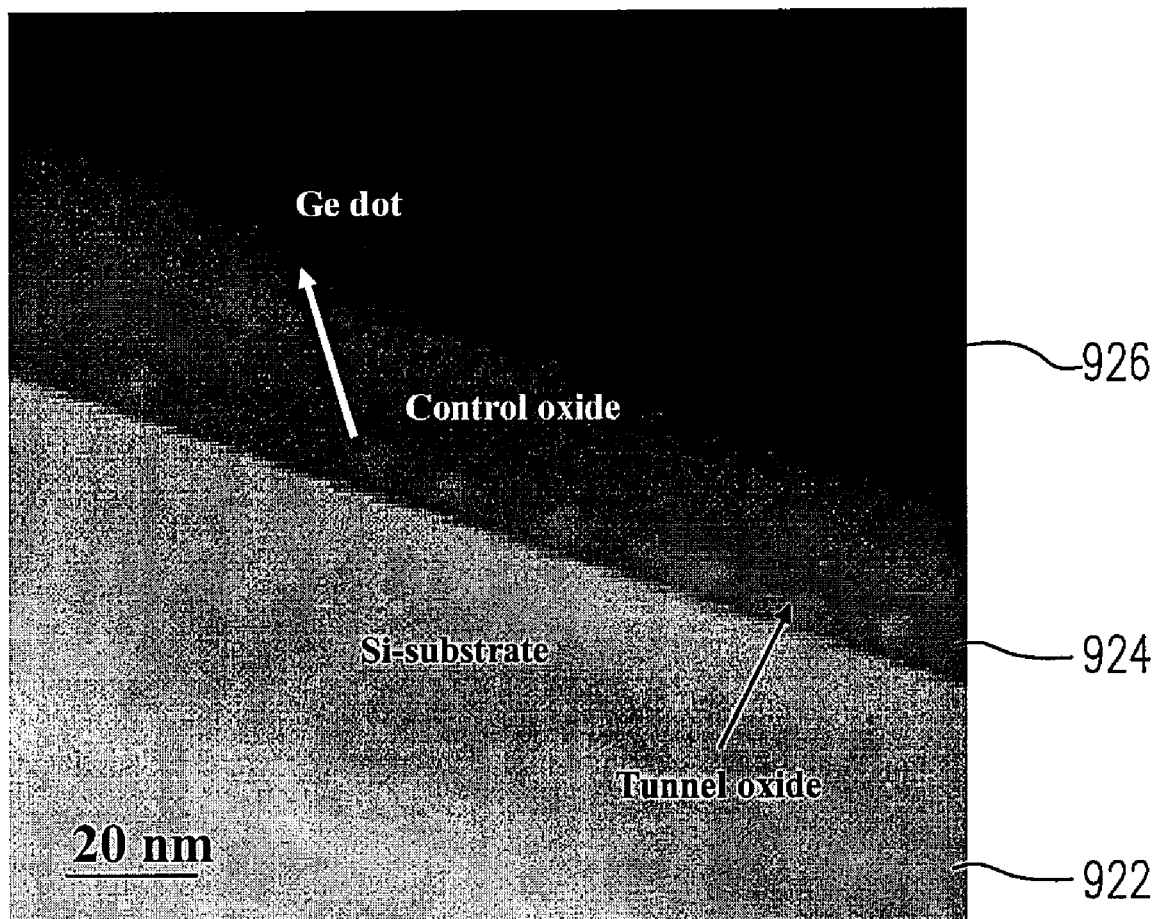
FIG. 15 is a photograph of a tested device under a transmission electron microscope according to experiment 2.

FIG. 15 is a photograph of a tested unit under a transmission electron microscope. As shown in FIG. 15, the educed germanium nano-dots 924 are about 5.5 nm in diameter. The germanium nano-dots 924 are settled on the tunneling layer 922 with a thickness of about 4.5 nm, and the germanium nano-dots 924 are separated from each other. Further, the germanium nano-dots 924, as deposited on the tunneling layer 922, have a density of about $6.2 \times 10^{11}/cm^2$.

Figure 16:
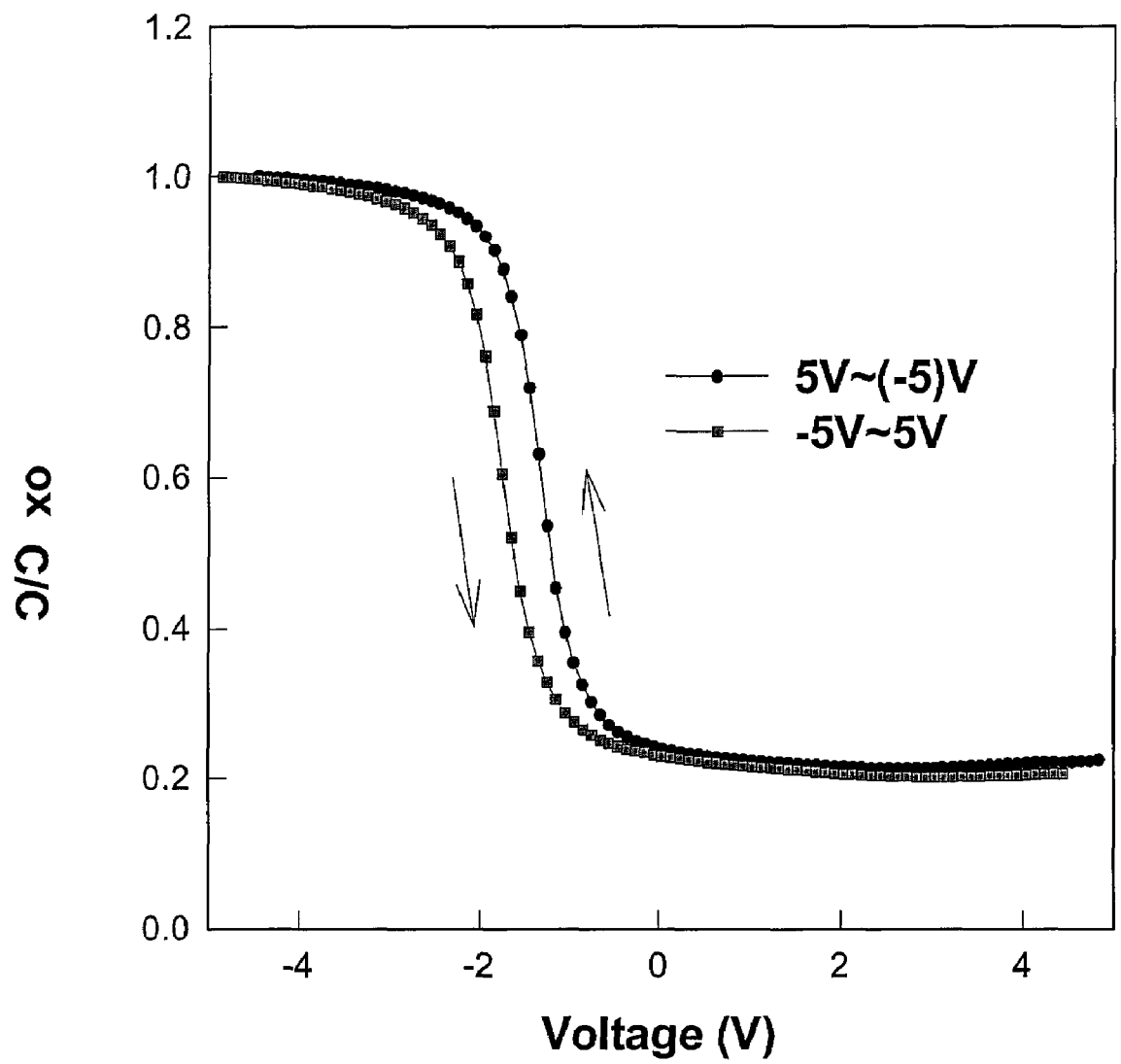
FIG. 16 is a graph showing relationship of capacitance and voltage of the tested unit via two-way scan of experiment 2.

Testing of Tested Unit: FIG. 16 illustrates relationship of capacitance and voltage of the tested unit through two-way scan. For operations of electron injecting or erasing, the curves of capacitance versus voltage (shown in FIG. 14) indicate that the deviation of the threshold voltage can reach to 0.42 V under an operating voltage of 5 V. Such a deviation is big enough to be used for differentiating the date value 0 and 1 of a logical circuit. Thus, the floating gate of this invention can be used in memory devices.

It will be apparent to those skilled in the art that various modifications and variations can be made to the structure and process of the present invention without departing from the scope or spirit of the invention. In view of the foregoing, it is intended that the present invention covers modifications and variations of this invention provided they fall within the scope of the following claims and their equivalents.

What is claimed is:

1. A method of manufacturing a floating gate, comprising:
forming a tunneling layer on a substrate;
forming a semiconductor silicide layer on the tunneling layer;
performing a first oxidation process to oxidize the semiconductor silicide layer so that the semiconductor component in the semiconductor silicide layer is educed and settled on the tunneling layer to form a plurality of semiconductor nano-dots; and
performing a second oxidation process to oxidize the semiconductor nano-dots so as to form a semiconductor oxide layer consisting of nano-dots or a thin film.

2. The method according to claim 1, wherein the first oxidation step is of dry oxidation or wet oxidation.

3. The method according to claim 1, the second oxidation step is of wet oxidation.

4. The method according to claim 1, further comprising, between the first and the second oxidation processes, a thermal process to reduce the partially oxidized semiconductor component so that the semiconductor nano-dots are educed.

5. The method according to claim 1, wherein the semiconductor component in the semiconductor silicide layer is selected from the group consisting of Group II elements, Group III elements, Group IV elements, Group V elements, Group VI elements, and compounds thereof.

6. The method according to claim 1, wherein the semiconductor component in the semiconductor silicide layer is selected form the group consisting of germanium (Ge), gallium arsenide (GaAs), gallium phosphide (GaP), indium phosphide (InP), cadmium sulfide (CdS), zinc sulfide (ZnS), and zinc selenide (ZnSe).

* * * * *